United States Patent
Ikeda

(10) Patent No.: US 9,935,096 B2
(45) Date of Patent: Apr. 3, 2018

(54) ELECTROSTATIC PROTECTION CIRCUIT, SEMICONDUCTOR INTEGRATED CIRCUIT DEVICE, AND ELECTRONIC DEVICE

(71) Applicant: SEIKO EPSON CORPORATION, Tokyo (JP)

(72) Inventor: Masuhide Ikeda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/370,878

(22) Filed: Dec. 6, 2016

(65) Prior Publication Data

US 2017/0179106 A1    Jun. 22, 2017

(30) Foreign Application Priority Data

Dec. 16, 2015   (JP) ................................. 2015-244928

(51) Int. Cl.
| | |
|---|---|
| *H01L 29/74* | (2006.01) |
| *H01L 31/111* | (2006.01) |
| *H01L 27/02* | (2006.01) |
| *H01L 27/06* | (2006.01) |

(52) U.S. Cl.
CPC ...... *H01L 27/0248* (2013.01); *H01L 27/0251* (2013.01); *H01L 27/0635* (2013.01); *H01L 29/742* (2013.01); *H01L 29/7408* (2013.01); *H01L 29/7412* (2013.01)

(58) Field of Classification Search
CPC ............. H01L 27/0248; H01L 27/0635; H01L 29/7408; H01L 29/7412; H01L 29/742

USPC ........................................................ 257/168
See application file for complete search history.

(56) References Cited

U.S. PATENT DOCUMENTS

| | | |
|---|---|---|
| 2014/0192445 A1 | 7/2014 | Ikeda |
| 2015/0162745 A1 | 6/2015 | Ikeda |
| 2015/0162746 A1 | 6/2015 | Ikeda |
| 2016/0149403 A1 | 5/2016 | Ikeda |
| 2016/0241021 A1* | 8/2016 | Wang ..................... H02H 9/046 |

FOREIGN PATENT DOCUMENTS

| | | |
|---|---|---|
| EP | 0803955 A2 | 10/1997 |
| JP | H10-050494 A | 2/1998 |
| JP | 2014-132717 A | 7/2014 |
| JP | 2015-115338 A | 6/2015 |
| JP | 2015-115339 A | 6/2015 |

(Continued)

*Primary Examiner* — David S Blum
(74) *Attorney, Agent, or Firm* — Oliff PLC

(57) ABSTRACT

Provided is an electrostatic protection circuit that has little leakage current under normal operation and allows a trigger voltage to be set comparatively freely, without requiring a special process step. This electrostatic protection circuit is provided with a series circuit including a transistor, a predetermined number of diodes and an impedance element that are connected in series between the first node and the second node, and a discharge circuit configured to send current from the first node to the second node following an increase in a potential difference that occurs between both ends of the impedance element, when the first node reaches a higher potential than the second node and current flows through the series circuit. The predetermined number of diodes are connected between the source and the back gate of the transistor.

14 Claims, 5 Drawing Sheets

(56) References Cited

FOREIGN PATENT DOCUMENTS

| | | |
|---|---|---|
| JP | 2016-100525 A | 5/2016 |
| JP | 2016-119388 A | 6/2016 |
| JP | 2016-119389 A | 6/2016 |

* cited by examiner

ELECTROSTATIC PROTECTION CIRCUIT, SEMICONDUCTOR INTEGRATED CIRCUIT DEVICE, AND ELECTRONIC DEVICE

BACKGROUND

1. Technical Field

The present invention relates to an electrostatic protection circuit that protects an internal circuit of a semiconductor integrated circuit device from ESD (electrostatic discharge). Furthermore, the invention relates to a semiconductor integrated circuit device that incorporates such an electrostatic protection circuit and an electronic device or the like that uses such a semiconductor integrated circuit device.

2. Related Art

Provision of semiconductor integrated circuit devices with an electrostatic protection circuit is carried out in order to prevent an internal circuit from being damaged due to static electricity charged on a person's body, a conveyance device or the like being applied to the internal circuit. For example, the electrostatic protection circuit is connected between a first terminal to which a power supply potential on a high potential side is supplied and a second terminal to which a power supply potential on a low potential side is supplied. A positive charge is discharged to the second terminal via the electrostatic protection circuit when a positive charge is applied to the first terminal by electrostatic discharge or the like, thus enabling damage to the internal circuit to be prevented since an excessive voltage is not applied to the internal circuit.

As related technology, JP-A-10-50494 (Claim 1; FIGS. 2, 4, 5) discloses an ESD protection circuit that includes a high-voltage terminal and a reference voltage terminal, a SCR circuit that is connected between these terminals, and a breakdown device that is connected between the terminals in order to electrically start conduction at a predetermined voltage and trigger conduction of the SCR circuit.

In the ESD protection circuit shown in FIG. 2 of JP-A-10-50494, a zener diode Z2 breaks down and a PNP transistor Q1 is turned on when the voltage between the high-voltage terminal and the reference voltage terminal exceeds a predetermined voltage. The voltage between both ends of a resistor R2 thereby rises and an NPN transistor Q2 is also turned on. Accordingly, the trigger voltage of the SCR circuit can be set by the breakdown voltage of the zener diode Z2.

However, a special process step is required in order to form the zener diode in the semiconductor integrated circuit device. That is, an impurity doping step (implantation step) for adjusting the impurity concentration is required in order to set the breakdown voltage of the zener diode to an appropriate value.

In the ESD protection circuit shown in FIG. 4 of JP-A-10-50494, an N-channel MOS transistor MN1 or a P-channel MOS transistor MP1 in which the gate is short-circuited to the source is used instead of a zener diode. In this case, the special process step is not needed.

However, because the trigger voltage of the SCR circuit is determined by characteristics such as the breakdown voltage or snapback trigger voltage of the MOS transistor, fine adjustment is not possible. Also, the trigger voltage of the SCR circuit is desirably lower than the breakdown voltage of the MOS transistor that is used in the internal circuit.

In the ESD protection circuit shown in FIG. 5 of JP-A-10-50494, a zener diode DZ1 is connected between a high-voltage terminal (pad) and the gate of an N-channel MOS transistor MN2. Although the trigger voltage of the SCR circuit is, similarly to the ESD protection circuit shown in FIG. 2, determined by the breakdown voltage of a zener diode, the size of the zener diode can be greatly reduced. However, the special process step is still required in order to form the zener diode.

Using a plurality of diodes connected in series in the forward direction instead of the zener diode DZ1 in FIG. 5 of JP-A-10-50494 is also conceivable. In this case, the special process step is not required. The trigger voltage of the SCR circuit can also be easily adjusted by adjusting the number of diodes connected in series. However, because the current in the forward direction flows through the diodes even when the voltage between the high-voltage terminal and the reference voltage terminal is low, there is a problem in that the leakage current of the trigger circuit part is large under normal operation.

SUMMARY

In view of this, an advantage of some aspects of the invention is to provide an electrostatic protection circuit that has little leakage current under normal operation and allows the trigger voltage to be set comparatively freely, without requiring a special process step. Also, another advantage of some aspects of the invention is to provide a semiconductor integrated circuit device that incorporates such an electrostatic protection circuit, and a further advantage of some aspects of the invention is to provide an electronic device or the like that uses such a semiconductor integrated circuit device.

An electrostatic protection circuit according to a first aspect of the invention is an electrostatic protection circuit configured to be connected to a first terminal via a first node and connected to a second terminal via a second node, including (i) a series circuit including a transistor, a predetermined number of diodes and an impedance element that are connected in series between the first node and the second node, at least the predetermined number of diodes being connected between a source and a back gate of the transistor, and (ii) a discharge circuit configured to send current from the first node to the second node following an increase in a potential difference that occurs between both ends of the impedance element, when the first node reaches a higher potential than the second node and current flows through the series circuit.

According to this aspect of the invention, a transistor and a predetermined number of diodes are connected in series between a first node and a second node, thus preventing leakage current from flowing through the diode as long as the transistor is not turned on. Also, a potential difference arises between the source and back gate of the transistor due to the diodes, and the effective threshold voltage of the transistor rises due to a back gate effect. As a result, an electrostatic protection circuit can be provided that has little leakage current under normal operation and allows the trigger voltage to be set comparatively freely, without requiring a special process step.

Here, the transistor may be constituted by an N-channel transistor and the back gate of the transistor may be connected to the second node. Also, the predetermined number of diodes may be constituted by a plurality of diodes connected in series in the forward direction toward the second node from the source of the transistor. In this case, the effective threshold voltage of the N-channel transistor can be raised by making the potential of the source of the N-channel transistor higher than the potential of the back gate using the plurality of diodes.

Alternatively, the transistor may be constituted by a P-channel transistor and the back gate of the transistor may be connected to the first node. Also, the predetermined number of diodes may be constituted by a plurality of diodes connected in series in the forward direction toward the source of the transistor from the first node. In this case, the effective threshold voltage of the P-channel transistor can be raised by making the potential of the source of the P-channel transistor lower than the potential of the back gate using the plurality of diodes.

In the above, the discharge circuit may include a thyristor connected between the first node and the second node and a second transistor that changes the thyristor to a conduction state following an increase in the potential difference that occurs between both ends of the impedance element. A discharge circuit that is capable of high-speed operation and can also withstand high power can thereby be realized.

An semiconductor integrated circuit device according to a second aspect of the invention includes any of the above electrostatic protection circuits. According to the second aspect of the invention, a semiconductor integrated circuit device can be provided that incorporates an electrostatic protection circuit that has little leakage current under normal operation and allows the trigger voltage to be set comparatively freely, without requiring a special process step.

An electronic device according to a third aspect of the invention includes the above semiconductor integrated circuit device. According to the third aspect of the invention, an electronic device that is trouble-free and has low power consumption can be provided, using a semiconductor integrated circuit device incorporating an electrostatic protection circuit that has little leakage current under normal operation and allows the trigger voltage to be set comparatively freely.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
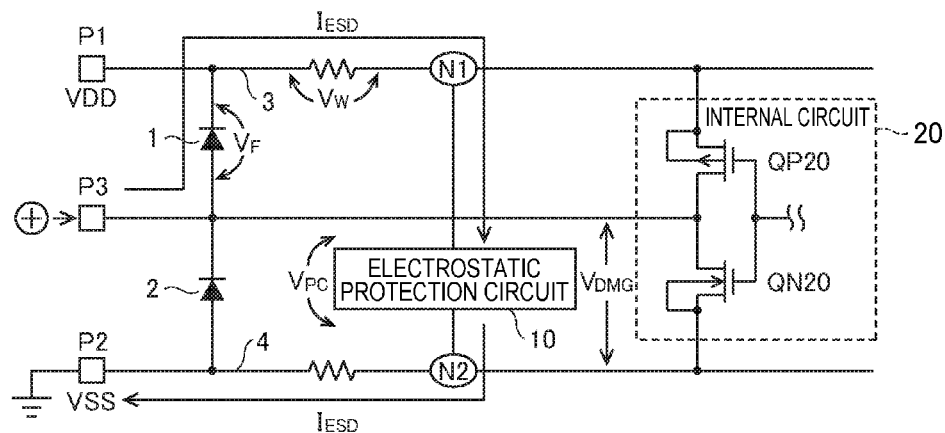
FIG. 1 is a circuit diagram showing an exemplary configuration of a semiconductor integrated circuit device according to one embodiment of the invention.

Hereinafter, embodiments of the invention will be described in detail, with reference to the drawings. Note that the same reference numerals are given to constituent elements that are the same, and redundant description will be omitted.

Figure 2:
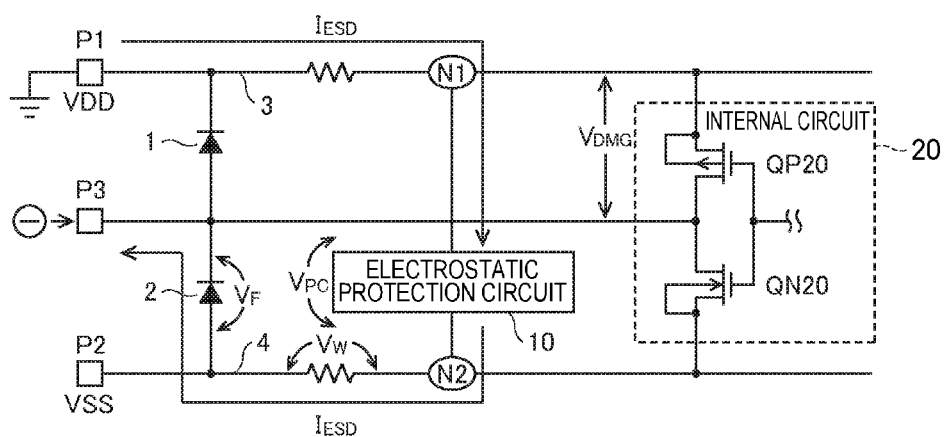
FIG. 2 is a circuit diagram showing an exemplary configuration of a semiconductor integrated circuit device according to one embodiment of the invention.

FIGS. 1 and 2 are circuit diagrams showing an exemplary configuration of a semiconductor integrated circuit device according to one embodiment of the invention. This semiconductor integrated circuit device includes power supply terminals P1 and P2, a signal terminal P3, diodes 1 and 2, power supply interconnects 3 and 4, an electrostatic protection circuit 10 according to one of the embodiments of the invention, and an internal circuit 20. Each of the power supply interconnects 3 and 4 has a resistance component. Also, the internal circuit 20 includes a P-channel MOS transistor QP20 and an N-channel MOS transistor QN20.

In FIGS. 1 and 2, the signal terminal P3 is connected to an output side of the internal circuit 20 (drain of the transistors QP20 and QN20), but the signal terminal P3 may be connected to an input side of the internal circuit 20 (gate of the transistors QP20 and QN20). In any case, the operating specifications of the electrostatic protection circuit 10 are mainly determined by the gate breakdown voltage of the transistors of the internal circuit 20.

For example, the electrostatic protection circuit 10 may be connected between the power supply terminal P1 to which a power supply potential VDD on the high potential side is supplied and the power supply terminal P2 to which a power supply potential VSS on the low potential side is supplied. Also, the electrostatic protection circuit 10 may be connected between the power supply terminal P1 and the signal terminal P3, or may be connected between the signal terminal P3 and the power supply terminal P2. In the following embodiments, the case where the electrostatic protection circuit 10 is connected to the power supply terminal P1 via the node N1 and is connected to the power supply terminal P2 via the node N2, as shown in FIGS. 1 and 2, will be described as an example.

When a positive charge is applied to the power supply terminal P2 by electrostatic discharge or the like, a positive charge is discharged to the signal terminal P3 via the diode 2 or is discharged to the power supply terminal P1 via the diodes 2 and 1, thus preventing damage to the internal circuit 20 since an excessive voltage is not applied to the internal circuit 20. Accordingly, a problem arises in the case where an reverse voltage is applied to at least one of the diodes 1 and 2.

The discharge path in the case where a positive charge is applied to the signal terminal P3 by electrostatic discharge or the like while the power supply terminal P2 is grounded is shown in FIG. 1. Due to electrostatic discharge or the like, a surge current $I_{ESD}$ flows on a path through the diode 1, the power supply interconnect 3, the electrostatic protection circuit 10 and the power supply interconnect 4.

In the discharge operation, the electrostatic protection circuit 10 can protect the internal circuit 20, if the drain-source voltage of the transistor QN20 connected in parallel to the diode 2 to which the reverse voltage is applied is smaller than a breakdown voltage $V_{DMG}$ that results in the transistor QN20 being damaged. To achieve this, the following equation (1) needs to be satisfied.

$$V_F + V_W + V_{PC} < V_{DMG} \qquad (1)$$

Here, $V_F$ is the forward voltage of the diode 1, $V_W$ is the voltage that is produced when the surge current $I_{ESD}$ flows through the resistance component of the power supply interconnect 3, and $V_{PC}$ is the voltage that is produced when the surge current $I_{ESD}$ flows through the electrostatic protection circuit 10.

Also, the discharge path in the case where a negative charge is applied to the signal terminal P3 by electrostatic discharge or the like while the power supply terminal P1 is grounded is shown in FIG. 2. Due to electrostatic discharge or the like, the surge current $I_{ESD}$ flows in a path through the power supply interconnect 3, the electrostatic protection circuit 10, the power supply interconnect 4 and the diode 2.

In the discharge operation, the electrostatic protection circuit 10 can protect the internal circuit 20, if the source-drain voltage of the transistor QP20 connected in parallel to the diode 1 to which the reverse voltage is applied is smaller than breakdown voltage $V_{DMG}$ that results in the transistor QP20 being damaged. To achieve this, the following equation (2) needs to be satisfied.

$$V_F + V_W + V_{PC} < V_{DMG} \qquad (2)$$

Here, $V_F$ is the forward voltage of the diode 2, $V_W$ is the voltage that is produced when the surge current $I_{ESD}$ flows through the resistance component of the power supply interconnect 4, and $V_{PC}$ is the voltage that is produced when the surge current $I_{ESD}$ flows through the electrostatic protection circuit 10.

As is evident from equations (1) and (2), in the cases shown in FIGS. 1 and 2, the conditions for protecting the internal circuit 20 can be represented with the same equation. That is, the sum of the voltages that are produced in devices on the discharge path being smaller than the breakdown voltage $V_{DMG}$ that results in damage to elements of the internal circuit 20 serves as a condition for protecting the internal circuit 20. Providing such an electrostatic protection circuit 10 enables damage to the internal circuit 20 by electrostatic discharge or the like to be prevented in various types of semiconductor integrated circuit devices.

First Embodiment

Figure 3:
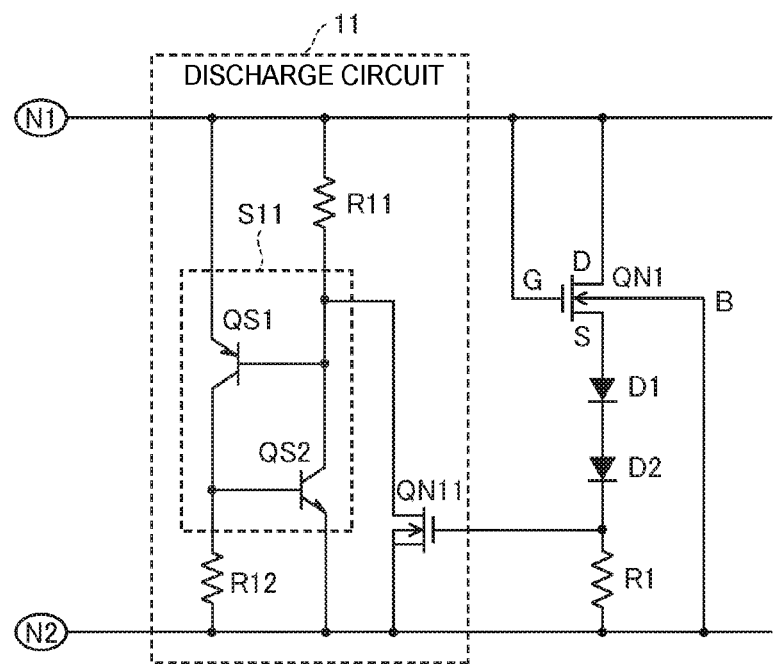
FIG. 3 is a circuit diagram showing an exemplary configuration of an electrostatic protection circuit according to a first embodiment of the invention.

FIG. 3 is a circuit diagram showing an exemplary configuration of the electrostatic protection circuit according to a first embodiment of the invention. As shown in FIG. 3, the electrostatic protection circuit includes a series circuit including an N-channel MOS transistor QN1, a predetermined number of diodes D1 and D2 and a resistance element R1 serving as an impedance element that are connected in series between a node N1 and a node N2.

In FIG. 3 and the like, two diodes D1 and D2 connected in series are shown as an example, but the number of diodes that are connected in series is determined according to the trigger voltage that is to be set for the electrostatic protection circuit. Also, the electrostatic protection circuit includes a discharge circuit 11 that sends current from the node N1 to the node N2 following an increase in the potential difference that occurs between both ends of the resistance element R1, when the node N1 reaches a higher potential than the node N2 and current flows through the series circuit.

The back gate (B) of the transistor QN1 is constituted by a P-type semiconductor substrate or a P-well arranged in a semiconductor substrate. At least the predetermined number of diodes D1 and D2 are connected between the back gate (B) and the source (S) of the transistor QN1. In the example shown in FIG. 3, the diodes D1 and D2 and the resistance element R1 are connected between the source (S) and back gate (B) of the transistor QN1.

For example, the drain (D) and the gate (G) of the transistor QN1 are connected to the node N1, and the back gate (B) is connected to the node N2. Also, the diodes D1 and D2 are connected in series in the forward direction toward the node N2 from the source (S) of the transistor QN1.

That is, the anode of the diode D1 is connected to the source (S) of the transistor QN1, and the cathode of the diode D2 is connected to the node N2 via the resistance element R1. The effective threshold voltage of the transistor QN1 can thereby be raised, by making the potential of the source (S) of the transistor QN1 higher than the potential of the back gate (B) using the diodes D1 and D2.

The discharge circuit 11 includes a thyristor S11 connected between the node N1 and the node N2, resistance elements R11 and R12, and an N-channel MOS transistor QN11. A discharge circuit 11 that is capable of high-speed operation and can also withstand high power can thereby be realized.

The thyristor S11 is constituted by a PNP bipolar transistor QS1 and an NPN bipolar transistor QS2. Here, the emitter of the transistor QS1 is equivalent to the anode of the thyristor S11, and the emitter of the transistor QS2 is equivalent to the cathode of the thyristor S11.

The emitter of the transistor QS1 is connected to the node N1, the collector is connected to the node N2 via the resistance element R12, and the base is connected to the node N1 via the resistance element R11. Also, the collector of the transistor QS2 is connected to the base of the transistor QS1, the emitter is connected to the node N2, and the base is connected to the collector of the transistor QS1.

The drain of the transistor QN11 is connected to the base of the transistor QS1, the source is connected to the node N2, and the gate is connected to the connection point of the diode D2 and the resistance element R1. The transistor QN11 changes the thyristor S11 to a conduction state (ON state) following an increase in the potential difference that occurs between both ends of the resistance element R1. That is, when the voltage between both ends of the resistance element R1 becomes greater than or equal to the threshold voltage of the transistor QN11, the thyristor S11 enters an ON state.

When a positive voltage (potential of node N1>potential of node N2) is applied between the node N1 and the node N2 and the gate-source voltage of the transistor QN1 becomes greater than or equal to the effective threshold voltage, the transistor QN1 enters an ON state, and current flows from the node N1 to the node N2 via the series circuit.

A potential difference thereby occurs between both terminals of the resistance element R1, and the gate-source voltage of the transistor QN11 of the discharge circuit 11 rises. When the gate-source voltage of the transistor QN11 becomes greater than or equal to the threshold voltage, the transistor QN11 enters an ON state, and current flows through the resistance element R11. As a result, a potential difference occurs between both terminals of the resistance element R11, and the thyristor S11 enters an ON state.

That is, when a potential difference occurs between both terminals of the resistance element R11 and the emitter-base voltage of the transistor QS1 becomes greater than or equal to the threshold voltage, the transistor QS1 enters an ON state, and current flows through the resistance element R12. Also, when a potential difference occurs between both terminals of the resistance element R12 and the base-emitter voltage of the transistor QS2 becomes greater than or equal to the threshold voltage, the transistor QS2 enters an ON state.

Thus, when a voltage that is greater than or equal to the trigger voltage is applied between the node N1 and the node N2, the discharge circuit 11 starts sending current from the node N1 to the node N2. When current continues flowing to the discharge circuit 11, the charge accumulated in the semiconductor integrated circuit device is discharged, and the voltage between the node N1 and the node N2 falls below a predetermined voltage.

Because the gate-source voltage of the transistor QN1 falls below the effective threshold voltage, the transistor QN1 thereby transitions from an ON state to an OFF state. As a result, the current that flows through the resistance element R1 decreases, causing the transistor QN11 of the discharge circuit 11 to transition from an ON state to an OFF state.

Generally, it is known that an effective threshold voltage Vt of a MOS transistor can be approximated with the following equation (3).

$$Vt \approx Vt0 + \gamma(Vsb)^{1/2} \qquad (3)$$
$$= Vt0 + \gamma(NxV_F)^{1/2}$$

Here, Vsb represents the potential difference between the source and back gate, Vt0 represents the threshold voltage when Vsb=0, γ represents a constant (e.g., about 0.7 to 1.4) that is dependent on the doping of the semiconductor substrate or well in which the MOS transistor is formed, N is a natural number representing the number of diodes connected in series, and $V_F$ represents the forward voltage of the diodes.

It is evident from equation (3) that the effective threshold voltage Vt of a MOS transistor increases as a result of increasing the number N of diodes. Accordingly, the voltage between the node N1 and the node N2 when the thyristor S11 enters an ON state, that is, the trigger voltage of the electrostatic protection circuit, can be set by the number N of diodes.

According to this embodiment, the transistor QN1 and the diodes D1 and D2 are connected in series between the node N1 and the node N2, thus preventing leakage current from flowing through the diodes D1 and D2, as long as the transistor QN1 is not turned on. Also, a potential difference occurs between the source and back gate of the transistor QN1 due to the diodes D1 and D2, and the effective threshold voltage of the transistor QN1 rises due to the back gate effect.

As a result, an electrostatic protection circuit can be provided that has little leakage current under normal operation and allows the trigger voltage to be set comparatively freely, without requiring a special process step. Furthermore, according to this embodiment, a semiconductor integrated circuit device can be provided that incorporates an electrostatic protection circuit that has little leakage current under normal operation and allows the trigger voltage to be set comparatively freely, without requiring a special process step.

Second Embodiment

Figure 4:
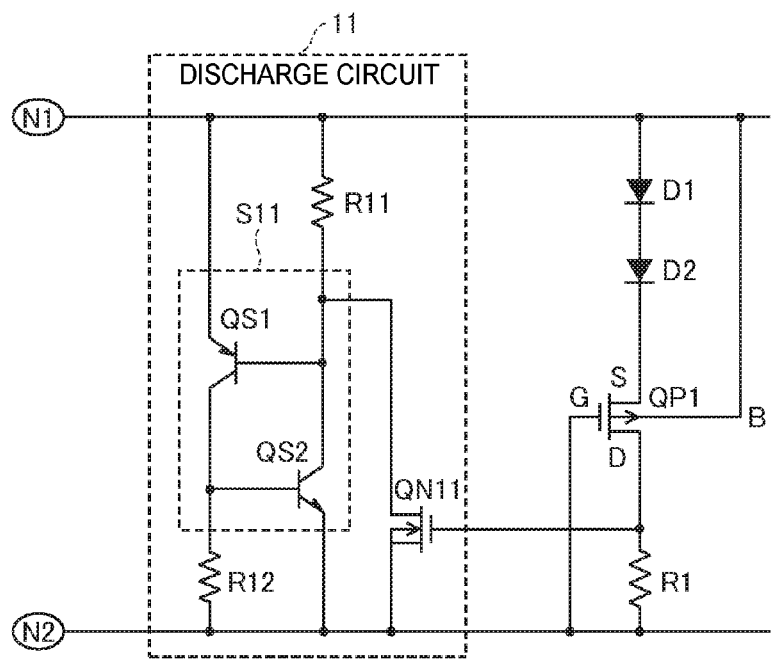
FIG. 4 is a circuit diagram showing an exemplary configuration of an electrostatic protection circuit according to a second embodiment of the invention.

FIG. 4 is a circuit diagram showing an exemplary configuration of an electrostatic protection circuit according to a second embodiment of the invention. As shown in FIG. 4, the electrostatic protection circuit according to the second embodiment includes a series circuit including a predetermined number of diodes D1 and D2, a P-channel MOS transistor QP1 and a resistance element R1 serving as an impedance element that are connected in series between a node N1 and a node N2. Regarding other points, the second embodiment may have a similar configuration to the first embodiment.

The back gate (B) of the transistor QP1 is constituted by an N-type semiconductor substrate or an N-well arranged in a semiconductor substrate. At least the predetermined number of diodes D1 and D2 are connected between the back gate (B) and source (S) of the transistor QP1. In the example shown in FIG. 4, only the diodes D1 and D2 are connected between the back gate (B) and source (S) of the transistor QP1.

For example, the drain (D) of the transistor QP1 is connected to the node N2 via the resistance element R1, the gate (G) is connected to the node N2, and the back gate (B) is connected to the node N1. Also, the diodes D1 and D2 are connected in series in the forward direction toward the source (S) of the transistor QP1 from the node N1.

That is, the anode of the diode D1 is connected to the node N1, and the cathode of the diode D2 is connected to the source (S) of the transistor QP1. The effective threshold voltage of the transistor QP1 can thereby be raised, by making the potential of the source (S) of the transistor QP1 lower than the potential of the back gate (B) using the diodes D1 and D2.

When a positive voltage (potential of node N1>potential of node N2) is applied between the node N1 and the node N2 and the source-gate voltage of the transistor QP1 becomes greater than or equal to the effective threshold voltage, the transistor QP1 enters an ON state, and current flows from the node N1 to the node N2 via the series circuit.

A potential difference thereby occurs between both terminals of the resistance element R1, and the gate-source voltage of the transistor QN11 of the discharge circuit 11 rises. When the gate-source voltage of the transistor QN11 becomes greater than or equal to the threshold voltage, the transistor QN11 enters an ON state, and current flows through the resistance element R11. As a result, a potential difference occurs between both terminals of the resistance element R11, and the thyristor S11 enters an ON state.

Thus, when a voltage that is greater than or equal to the trigger voltage is applied between the node N1 and the node N2, the discharge circuit 11 starts sending current from the node N1 to the node N2. When current continues flowing to the discharge circuit 11, the charge accumulated in the semiconductor integrated circuit device is discharged, and the voltage between the node N1 and the node N2 falls below a predetermined voltage.

Because the source-gate voltage of the transistor QP1 falls below the effective threshold voltage, the transistor QP1 thereby transitions from an ON state to an OFF state. As a result, the current that flows through the resistance element R1 decreases, causing the transistor QP11 of the discharge circuit 11 transitions from an ON state to an OFF state.

Similar effects to the first embodiment can also be achieved according to this embodiment.

Third Embodiment

Figure 5:
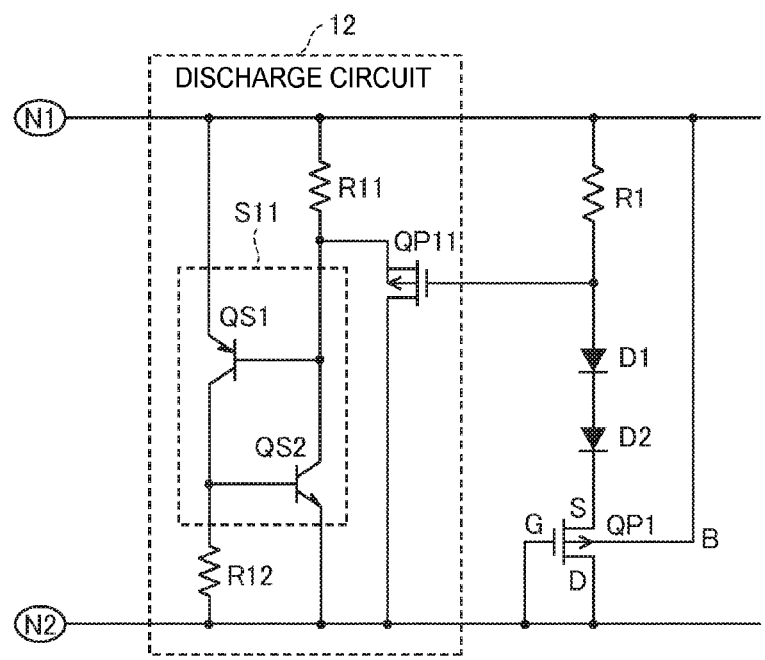
FIG. 5 is a circuit diagram showing an exemplary configuration of an electrostatic protection circuit according to a third embodiment of the invention.

FIG. 5 is a circuit diagram showing an exemplary configuration of an electrostatic protection circuit according to a third embodiment of the invention. As shown in FIG. 5, the electrostatic protection circuit according to the third embodiment includes a series circuit including a resistance element R1 serving as an impedance element, a predetermined number of diodes D1 and D2 and a P-channel MOS transistor QP1 that are connected in series between a node N1 and a node N2. Also, a discharge circuit 12 includes a P-channel MOS transistor QP11. Regarding other points, the third embodiment may have a similar configuration to the first embodiment.

The back gate (B) of the transistor QP1 is constituted by an N-type semiconductor substrate or an N-well arranged in a semiconductor substrate. At least the predetermined number of diodes D1 and D2 are connected between the back gate (B) and source (S) of the transistor QP1. In the example shown in FIG. 5, the resistance element R1 and the diodes D1 and D2 are connected between the back gate (B) and source (S) of the transistor QP1.

For example, the drain (D) and gate (G) of the transistor QP1 are connected to the node N2, and the back gate (B) is connected to the node N1. Also, the diodes D1 and D2 are connected in series in the forward direction toward the source (S) of the transistor QP1 from the node N1.

That is, the anode of the diode D1 is connected to the node N1 via the resistance element R1, and the cathode of the diode D2 is connected to the source (S) of the transistor QP1. The effective threshold voltage of the transistor QP1 can thereby be raised by making the potential of the source (S) of the transistor QP1 lower than the potential of the back gate (B) using the diodes D1 and D2.

When a positive voltage (potential of node N1>potential of node N2) is applied between the node N1 and the node N2 and the source-gate voltage of the transistor QP1 becomes greater than or equal to the effective threshold voltage, the transistor QP1 enters an ON state, and current flows from the node N1 to the node N2 via the series circuit.

A potential difference thereby occurs between both terminals of the resistance element R1, and the source-gate voltage of the transistor QP11 of the discharge circuit 12 rises. When the source-gate voltage of the transistor QP11 becomes greater than or equal to the threshold voltage, the transistor QP11 enters an ON state, and current flows through the resistance element R11. As a result, a potential difference occurs between both terminals of the resistance element R11, and the thyristor S11 enters an ON state.

Thus, when a voltage that is greater than or equal to the trigger voltage is applied between the node N1 and the node N2, the discharge circuit 12 starts sending current from the node N1 to the node N2. When current continues flowing to the discharge circuit 12, the charge accumulated in the semiconductor integrated circuit device is discharged, and the voltage between the node N1 and the node N2 falls below a predetermined voltage.

Because the source-gate voltage of the transistor QP1 falls below the effective threshold voltage, the transistor QP1 thereby transitions from an ON state to an OFF state. As a result, the current that flows through the resistance element R1 decreases, causing the transistor QP11 of the discharge circuit 12 to transition from an ON state to an OFF state.

Similar effects to the first embodiment can also be achieved according to this embodiment.

Fourth Embodiment

Figure 6:
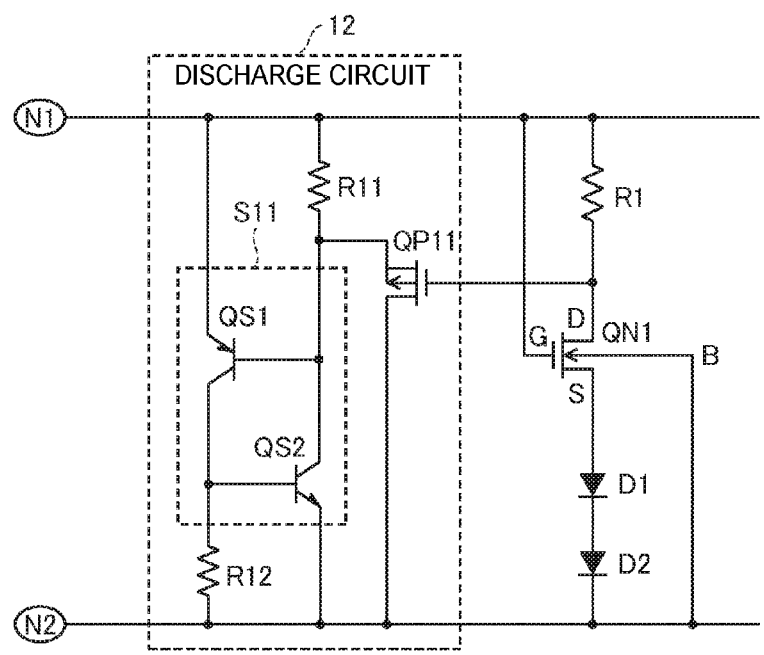
FIG. 6 is a circuit diagram showing an exemplary configuration of an electrostatic protection circuit according to a fourth embodiment of the invention.

FIG. 6 is a circuit diagram showing an exemplary configuration of an electrostatic protection circuit according to a fourth embodiment of the invention. As shown in FIG. 6, the electrostatic protection circuit according to the fourth embodiment includes a series circuit including a resistance element R1 serving as an impedance element, an N-channel MOS transistor QN1 and a predetermined number of diodes D1 and D2 that are connected in series between a node N1 and a node N2. Regarding other points, the fourth embodiment may have a similar configuration to the third embodiment.

The back gate (B) of the transistor QN1 is constituted by a P-type semiconductor substrate or a P-well arranged in a semiconductor substrate. At least the predetermined number of diodes D1 and D2 are connected between the source (S) and back gate (B) of the transistor QN1. In the example shown in FIG. 6, only the diodes D1 and D2 are connected between the source (S) and back gate (B) of the transistor QN1.

For example, the drain (D) of the transistor QN1 is connected to the node N1 via the resistance element R1, the gate (G) is connected to the node N1, and the back gate (B) is connected to the node N2. Also, the diodes D1 and D2 are connected in series in the forward direction toward the node N2 from the source (S) of the transistor QN1.

That is, the anode of the diode D1 is connected to the source (S) of the transistor QN1, and the cathode of the diode D2 is connected to the node N2. The effective threshold voltage of the transistor QN1 can thereby be raised by making the potential of the source (S) of the transistor QN1 higher than the potential of the back gate (B) using the diodes D1 and D2.

When a positive voltage (potential of node N1>potential of node N2) is applied between the node N1 and the node N2 and the gate-source voltage of the transistor QN1 becomes greater than or equal to the effective threshold voltage, the transistor QN1 enters an ON state, and current flows from the node N1 to the node N2 via the series circuit.

A potential difference thereby occurs between both terminals of the resistance element R1, and the source-gate voltage of the transistor QP11 of the discharge circuit 12 rises. When the source-gate voltage of the transistor QP11 becomes greater than or equal to the threshold voltage, the transistor QP11 enters an ON state, and current flows through the resistance element R11. As a result, a potential difference occurs between both terminals of the resistance element R11, and the thyristor S11 enters an ON state.

Thus, when a voltage that is greater than or equal to the trigger voltage is applied between the node N1 and the node N2, the discharge circuit 12 starts sending current from the node N1 to the node N2. When current continues flowing to the discharge circuit 12, the charge accumulated in the semiconductor integrated circuit device is discharged, and the voltage between the node N1 and the node N2 falls below a predetermined voltage.

Because the gate-source voltage of the transistor QN1 falls below the effective threshold voltage, the transistor QN1 transitions from an ON state to an OFF state. As a result, the current that flows through the resistance element R1 decreases, causing the transistor QP11 of the discharge circuit 12 transitions from an ON state to an OFF state.

Similar effects to the first embodiment can also be achieved according to this embodiment.

Fifth Embodiment

Figure 7:
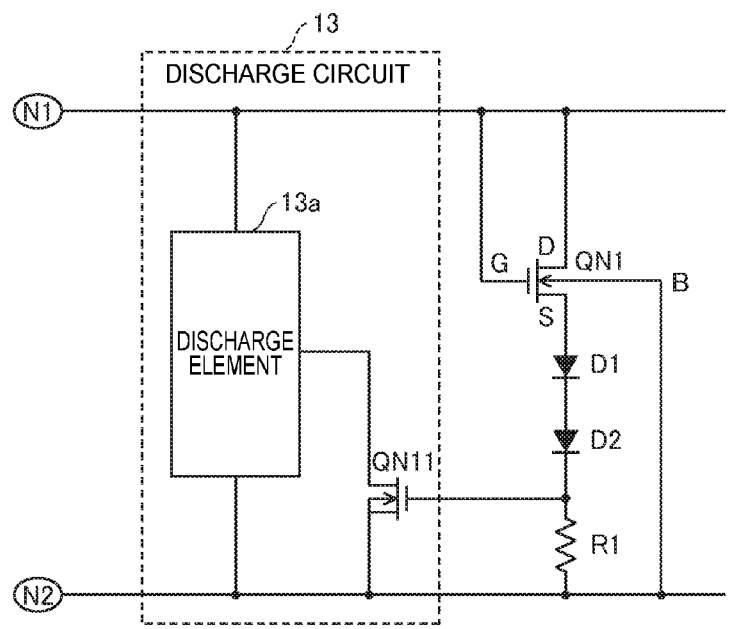
FIG. 7 is a circuit diagram showing an exemplary configuration of an electrostatic protection circuit according to a fifth embodiment of the invention.

FIG. 7 is a circuit diagram showing an exemplary configuration of an electrostatic protection circuit according to a fifth embodiment of the invention. The electrostatic protection circuit according to the fifth embodiment includes a discharge circuit 13 instead of the discharge circuit 11 in the first embodiment shown in FIG. 3. Regarding other points, the fifth embodiment may have a similar configuration to the first embodiment.

As shown in FIG. 7, the discharge circuit 13 includes a discharge element 13a connected between a node N1 and a node N2, and an N-channel MOS transistor QN11 that supplies a control signal to the discharge element 13a. The drain of the transistor QN11 is connected to the control terminal of the discharge element 13a, the source is connected to the node N2, and the gate is connected to the connection point of the diode D2 and the resistance element R1.

When a positive voltage (potential of node N1>potential of node N2) is applied between the node N1 and the node N2 and the gate-source voltage of the transistor QN1 becomes greater than or equal to the effective threshold voltage, the transistor QN1 enters an ON state, and current flows from the node N1 to the node N2 via the series circuit.

A potential difference thereby occurs between both terminals of the resistance element R1, and the gate-source voltage of the transistor QN11 of the discharge circuit 13 rises. When the gate-source voltage of the transistor QN11 becomes greater than or equal to the threshold voltage, the transistor QN11 enters an ON state, the potential of the control terminal of the discharge element 13a approaches the potential of the node N2, and the discharge element 13a sends current from the node N1 to the node N2. Similar effects to the first embodiment can also be achieved according to this embodiment.

Sixth Embodiment

Figure 8:
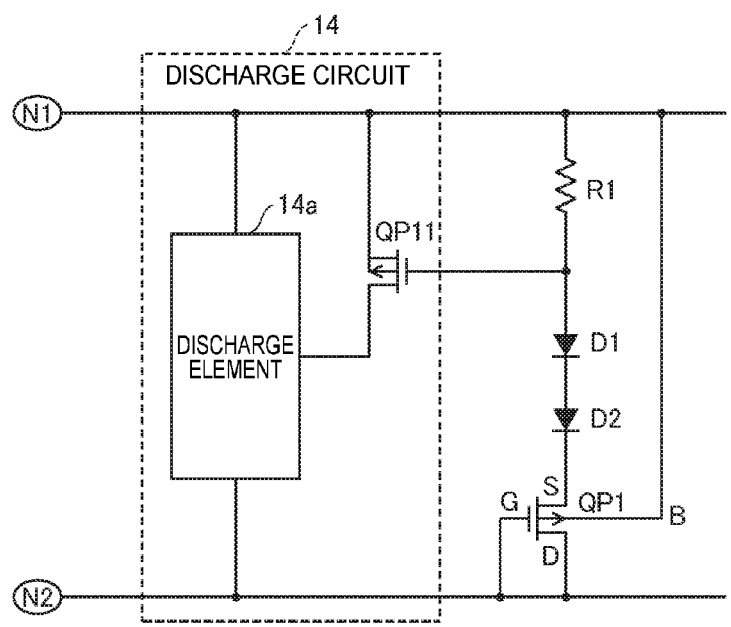
FIG. 8 is a circuit diagram showing an exemplary configuration of an electrostatic protection circuit according to a sixth embodiment of the invention.

FIG. 8 is a circuit diagram showing an exemplary configuration of an electrostatic protection circuit according to a sixth embodiment of the invention. The electrostatic protection circuit according to the sixth embodiment includes a discharge circuit 14 instead of the discharge circuit 12 in the third embodiment shown in FIG. 5. Regarding other points, the sixth embodiment may have a similar configuration to the third embodiment.

As shown in FIG. 8, the discharge circuit 14 includes a discharge element 14a connected between the node N1 and the node N2, and a P-channel MOS transistor QP11 that supplies a control signal to the discharge element 14a. The source of the transistor QP11 is connected to the node N1, the drain is connected to the control terminal of the discharge element 14a, and the gate is connected to the connection point of the resistance element R1 and the diode D1.

When a positive voltage (potential of node N1>potential of node N2) is applied between the node N1 and the node N2 and the source-gate voltage of the transistor QP1 becomes greater than or equal to the effective threshold voltage, the transistor QP1 enters an ON state, and current flows from the node N1 to the node N2 via the series circuit.

A potential difference thereby occurs between both terminals of the resistance element R1, and the source-gate voltage of the transistor QP11 of the discharge circuit 14 rises. When the source-gate voltage of the transistor QP11 becomes greater than or equal to the threshold voltage, the transistor QP11 enters an ON state, the potential of the control terminal of the discharge element 14a approaches the potential of the node N1, and the discharge element 14a sends current from the node N1 to the node N2. Similar effects to the first embodiment can also be achieved according to this embodiment.

Example of Discharge Element

Various types of three-terminal elements, circuits or the like having a function performing on/off control of the current in accordance with a control signal can also be used for the discharge circuit of the electrostatic protection circuit according to the first to sixth embodiments of the invention, besides the thyristor S11 shown in FIG. 3 and the like.

A metal oxide film field-effect transistor (MOS (Metal Oxide Semiconductor) FET), a junction field-effect transistor (Junction FET), a metal semiconductor field-effect transistor (Metal Semiconductor FET), a bipolar transistor and the like are given as the three-terminal element.

FIG. 9 is a diagram showing an example of a three-terminal element that can be used for the discharge circuit. Note that in FIGS. 9A to 9D, "NS" represents the node to which a control signal is supplied. For example, the P-channel MOS transistor shown in FIG. 9A or the PNP bipolar transistor shown in FIG. 9B can be used as the discharge element 13a shown in FIG. 7.

Figure 9A:
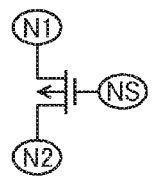
FIGS. 9A to 9D are diagrams showing an exemplary three-terminal element that can be used in a discharge circuit.
Figure 9B:
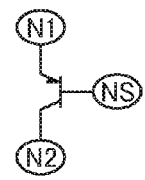
Figure 9C:
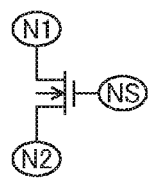
Figure 9D:
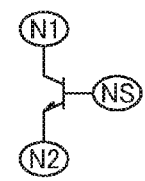

Alternatively, the N-channel MOS transistor shown in FIG. 9C or the NPN bipolar transistor shown in FIG. 9D can be used as the discharge element 14a shown in FIG. 8. Note that a resistor may be connected between the gate and source of a MOS transistor or between the base and emitter of a bipolar transistor.

Electronic Device

Next, an electronic device according to the first embodiment of the invention will be described.

Figure 10:
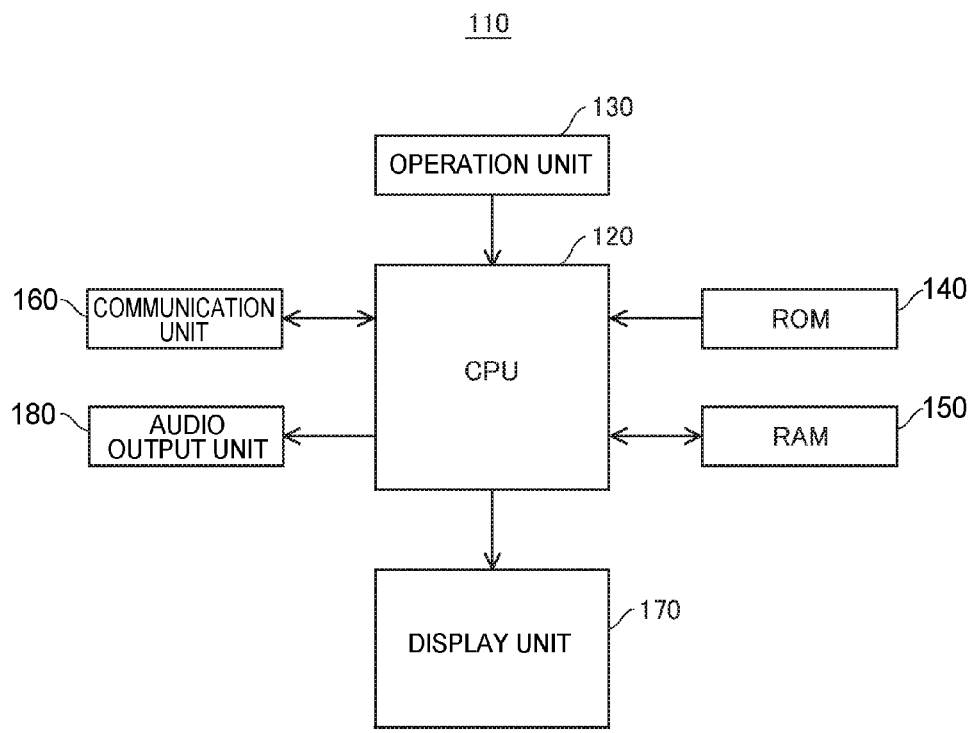
FIG. 10 is a block diagram showing an exemplary configuration of an electronic device according to one embodiment of the invention.

FIG. 10 is a block diagram showing an exemplary configuration of the electronic device according to the first embodiment of the invention. As shown in FIG. 10, an electronic device 110 may also include a CPU 120, an operation unit 130, a ROM (read-only memory) 140, a RAM (random access memory) 150, a communication unit 160, a display unit 170, and an audio output unit 180.

Here, at least some of the constituent elements from the CPU 120 and the ROM 140 to the audio output unit 180 are incorporated in the semiconductor integrated circuit device according to the first embodiment of the invention. Note that some of the constituent elements shown in FIG. 10 may be omitted or changed, or other constituent elements may be added to the constituent elements shown in FIG. 10.

The CPU 120 performs various types of signal processing and control processing using data and the like that are supplied from outside the device, in accordance with programs that are stored in the ROM 140 and the like. For example, the CPU 120 performs various processing such as performing various types of signal processing according to operation signals that are supplied from the operation unit 130, controlling the communication unit 160 in order to perform data communication with an external device, generating image signals for displaying various types of images on the display unit 170, and generating audio signals for outputting various types of audio from the audio output unit 180.

The operation unit 130 is, for example, an input device including operation keys, button switches or the like, and outputs operation signal that depend on operations by a user to the CPU 120. The ROM 140 stores programs, data and the like for the CPU 120 to perform various types of signal processing and control processing. Also, the RAM 150 is used as a work area of the CPU 120, and temporarily stores programs and data read out from the ROM 140, data input using the operation unit 130, and the results of operations executed by the CPU 120 in accordance with programs.

The communication unit 160 is constituted by analog circuitry and digital circuitry, and performs data communication between the CPU 120 and an external device, for example. The display unit 170 includes an LCD (liquid crystal display) or the like, for example, and displays various types of images based on image signals that are supplied from the CPU 120. Also, the audio output unit 180 includes a speaker or the like, for example, and outputs audio based on the audio signals that are supplied from the CPU 120.

The electronic device 110 corresponds, for example, to a mobile phone or similar mobile terminal, a smart card, a calculator, an electronic dictionary, an electronic game machine, a digital still camera, a digital movie camera, a video projector, a television, a TV phone, a security television monitor, a head-mounted display, a personal computer, a printer, a network device, a car navigation device, a measurement device, or a medical device (e.g., electronic thermometer, sphygmomanometer, blood glucose meter, electrocardiograph device, ultrasonic diagnostic apparatus, and electronic endoscope).

According to this embodiment, an electronic device that is trouble-free and has low power consumption can be provided, using a semiconductor integrated circuit device that incorporates an electrostatic protection circuit that has little leakage current under normal operation and allows the trigger voltage to be set comparatively freely.

Although, in the foregoing embodiments, the case of using a resistance element as an impedance element was described, a series circuit of a resistance element and an inductor, a parallel circuit of a resistance element and a capacitor, or the like, can also be used as an impedance element. The invention is thus not limited to the embodiments described above, and many modifications can be made within the technical idea of the invention, by a person having ordinary skill in the art.

The entire disclosure of Japanese Patent Application No. 2015-244928, filed Dec. 16, 2015 is expressly incorporated by reference herein.

What is claimed is:

1. An electrostatic protection circuit configured to be connected to a first power supply terminal via a first power supply node and connected to a second power supply terminal via a second power supply node, the electrostatic protection circuit comprising:
    a series circuit including a transistor, a predetermined number of diodes and an impedance element that are connected in series between the first power supply node and the second power supply node, at least the predetermined number of diodes being connected between a source and a back gate of the transistor; and
    a discharge circuit configured to send current from the first power supply node to the second power supply node following an increase in a potential difference that occurs between both ends of the impedance element, when the first power supply node reaches a higher potential than the second power supply node and current flows through the series circuit.

2. The electrostatic protection circuit according to claim 1, wherein the transistor is constituted by an N-channel transistor, and the back gate of the transistor is connected to the second power supply node.

3. The electrostatic protection circuit according to claim 1, wherein the transistor is constituted by a P-channel transistor, and the back gate of the transistor is connected to the first power supply node.

4. The electrostatic protection circuit according to claim 2, wherein the predetermined number of diodes are constituted by a plurality of diodes connected in series in a forward direction toward the second power supply node from the source of the transistor.

5. The electrostatic protection circuit according to claim 3, wherein the predetermined number of diodes are constituted by a plurality of diodes connected in series in a forward direction toward the source of the transistor from the first power supply node.

6. The electrostatic protection circuit according to claim 2, wherein the impedance element is connected between the predetermined number of diodes and the second power supply node.

7. The electrostatic protection circuit according to claim 2, wherein the impedance element is connected between the N-channel transistor and the first power supply node.

8. The electrostatic protection circuit according to claim 3, wherein the impedance element is connected between the P-channel transistor and the second power supply node.

9. The electrostatic protection circuit according to claim 3, wherein the impedance element is connected between the predetermined number of diodes and the first power supply node.

10. The electrostatic protection circuit according to claim 1, wherein the discharge circuit includes a thyristor connected between the first power supply node and the second power supply node, and a second transistor configured to change the thyristor to a conduction state following an increase in the potential difference that occurs between both ends of the impedance element.

11. A semiconductor integrated circuit device comprising the electrostatic protection circuit according to claim 1.

12. A semiconductor integrated circuit device comprising the electrostatic protection circuit according to claim 10.

13. An electronic device comprising the semiconductor integrated circuit device according to claim 11.

14. An electronic device comprising the semiconductor integrated circuit device according to claim 12.

* * * * *